United States Patent
Okazaki et al.

(10) Patent No.: US 6,511,778 B2
(45) Date of Patent: *Jan. 28, 2003

(54) PHASE SHIFT MASK BLANK, PHASE SHIFT MASK AND METHOD OF MANUFACTURE

(75) Inventors: Satoshi Okazaki, Nakakubiki-gun (JP); Ichiro Kaneko, Nakakubiki-gun (JP); Jiro Moriya, Nakakubiki-gun (JP); Masayuki Suzuki, Nakakubiki-gun (JP); Tamotsu Maruyama, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 57 days.

This patent is subject to a terminal disclaimer.

(21) Appl. No.: 09/753,517

(22) Filed: Jan. 4, 2001

(65) Prior Publication Data

US 2001/0006754 A1 Jul. 5, 2001

(30) Foreign Application Priority Data

| Jan. 5, 2000 | (JP) | 2000-000333 |
| Jan. 5, 2000 | (JP) | 2000-000336 |
| Jan. 5, 2000 | (JP) | 2000-000332 |
| Oct. 10, 2000 | (JP) | 2000-309453 |

(51) Int. Cl.$^7$ .............................. G03F 9/00; B32B 9/00
(52) U.S. Cl. ............................. 430/5; 428/428
(58) Field of Search ..................... 430/5, 322, 324; 428/432, 428; 427/595; 204/192.12

(56) References Cited

U.S. PATENT DOCUMENTS 5,631,109 A * 5/1997 Ito ........................... 430/5

| 5,945,237 A | 8/1999 | Tanabe |

FOREIGN PATENT DOCUMENTS

| DE | 19644287 | 4/1997 |
| EP | 0 643 331 | 3/1995 |
| EP | 0 838 726 | 4/1998 |
| GB | 2306699 A | 5/1997 |

OTHER PUBLICATIONS

Patent Abstracts of Japan, vol. 1998, No. 12, Oct. 31, 1998, & JP 10 186632.

Database WPI, Section Ch, Week 199938, Derwent Pub. Ltd., London, GB; AN 1999–448108 XP002165016 & JP 11 184067.

Database WPI, Section Ch, Week 199938, Derwent Pub. Ltd., London, GB; AN 1999–448104 XP002165017 & JP 11 184063.

* cited by examiner

Primary Examiner—S. Rosasco
(74) Attorney, Agent, or Firm—Millen, White, Zelano & Branigan, P.C.

(57) ABSTRACT

A phase shift mask blank comprising a transparent substrate and at least one layer of a phase shifter thereon, wherein the phase shifter is a film composed primarily of a fluorine-doped metal silicide, can be fabricated into a high-performance phase shift mask having adequate transmittance and good stability over time even when used with light sources that emit short-wavelength light. The phase shift mask can be used to fabricate semiconductor integrated circuits to a smaller minimum feature size and a higher level of integration.

20 Claims, 6 Drawing Sheets

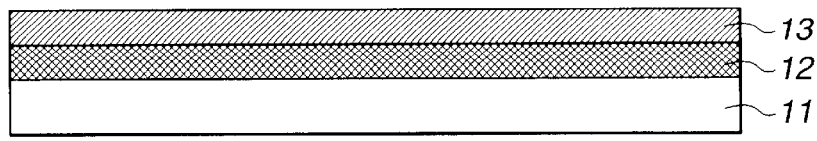
FIG.6A
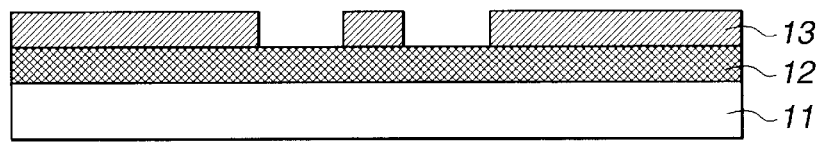
FIG.6B
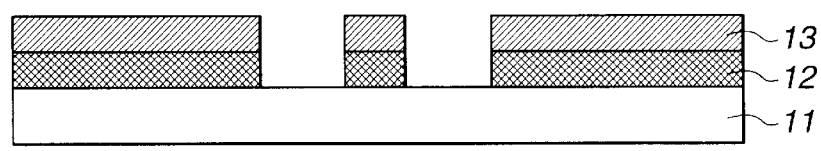
FIG.6C
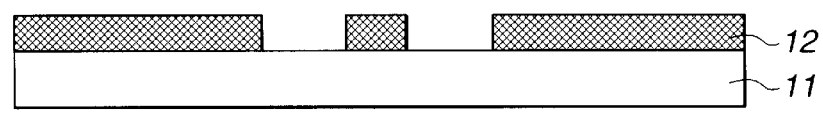
FIG.6D
FIG.7
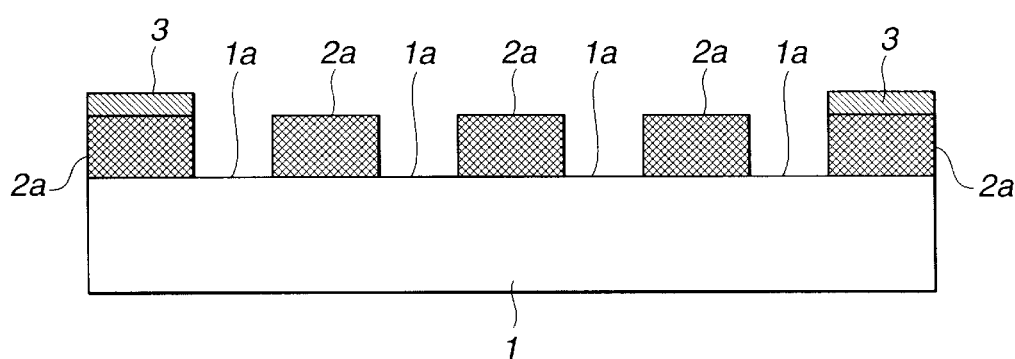

ELECTRIC
FIELD
OF LIGHT
AFTER
PASSING
THROUGH
MASK

LIGHT
INTENSITY
AT WAFER

180°
PHASE
SHIFT

PHASE SHIFT MASK BLANK, PHASE SHIFT MASK AND METHOD OF MANUFACTURE

BACKGROUND OF THE INVENTION

1. Field of the Invention

The present invention relates to a phase shift mask blank, a phase shift mask, and a method of manufacturing phase shift masks using a novel phase shifter material.

2. Prior Art

The shifter material used in halftone phase shift masks is often composed primarily of molybdenum silicide, although chromium oxide-based materials are also used.

As shown in FIGS. 10A and 10B, which are incorporated in and constitute part of the specification, a halftone phase shift mask is comprised of a quartz substrate 32 on which there is provided a shifter 34 which changes the phase of the light. The mask improves resolution by utilizing an interference effect between light that passes through the shifter 34 and undergoes a change of phase, and light that does not pass through the shifter 34 and does not undergo a change of phase.

The trends toward a higher level of integration and higher processing speed in large-scale integration (LSI) chips have created a need for a smaller pattern rule in semiconductor devices. The photomasks used to form those finer patterns must likewise be produced to a smaller feature size.

Efforts are being made to develop phase shift masks which meet these criteria. However, further reduction in the minimum feature size on the masks will require changing the exposure wavelength of light emitted by the light source used during mask fabrication from the i-line wavelength (365 nm) to that of KrF excimer laser light (248 nm), ArF excimer laser light (193 nm), and eventually $F_2$ laser light (157 nm).

This is because, in lithography, the resolution is proportional to the wavelength of the exposure light, as indicated by the Rayleigh formula:

$$R=k\lambda/NA$$

In the formula, R is the resolution, k is the process coefficient, $\lambda$ is the wavelength, and NA is the numerical aperture of the lens.

However, the molybdenum silicide-based shifter films which are most commonly used today have such a large absorption coefficient that very little, if any, short-wavelength light in the ArF excimer laser light (193 nm) and $F_2$ laser light (157 nm) regions passes through. Hence, these films are unsuitable for use together with such shorter wavelength exposure light sources.

In the case of chromium-based shifter films, those composed of chromium metal only have very little transmittance for the simple fact that they are metal. Even if the chromium metal has oxygen, nitrogen or carbon added to it, a transmittance sufficient for use as a phase shifter material in a short-wavelength region of 193 nm or less, such as a transmittance of 3 to 40%, has been difficult to achieve.

Moreover, because short-wavelength light of 193 nm or less has a much higher energy than 365 nm or 248 nm light, like the mask substrate and the lens optics, the phase transfer material is subject to deterioration over time. A need is thus felt for the development of a material capable of enduring high-energy irradiation.

At the same time, the phase shifter material must be capable of causing a 180 degree shift in the phase of light that passes through the shifter layer relative to light that does not pass through. Bearing in mind the topography of the shifter layer pattern, by forming the shifter film to a thickness D, defined as $$D=\lambda/2(n-1) \qquad (1)$$

from a material having a high refractive index n, a 180-degree phase shift can be achieved at a small film thickness or step on the substrate. In the foregoing formula, D is the shifter film thickness for generating a 180-degree phase shift, n is the refractive index of the shifter material, and $\lambda$ is the wavelength of the transmitted light.

However, prior-art chromium-based and molybdenum silicide-based shifter materials cannot provide a high refractive index at shorter exposure light wavelengths (i.e., wavelengths of 193 nm or less), and thus must have a large film thickness, making it difficult to achieve a phase shift of 180 degrees.

SUMMARY OF THE INVENTION

It is, therefore, an object of the present invention to provide phase shift mask blanks and phase shift masks which resolve the above drawbacks of prior-art halftone phase shift masks and make it possible to fabricate semiconductor integrated circuits having a smaller minimum feature size and a higher degree of integration. Another object of the invention is to provide a method of manufacturing such phase shift masks.

It has been found that phase shift mask blanks and phase shift masks comprising in part a phase shifter composed primarily of fluorine-doped metal silicide, and especially a phase shifter composed primarily of fluorine-doped chromium silicide, fluorine-doped molybdenum silicide or fluorine-doped gadolinium gallium silicide, have a good transmittance of from 3 to 40% to short-wavelength light of 193 nm or less, such as ArF excimer laser light and $F_2$ laser light, that cannot be attained with the chromium-based and molybdenum silicide-based shifter materials used to date. Such phase shift masks also have excellent durability to high energy irradiation and improved stability over time. It has also been found that fluorine-doped metal silicide films, by virtue of their high refractive indices, are capable of providing a 180-degree phase shift in transmitted light at a relatively small film thickness, thereby making it possible to minimize the effects (e.g., primarily focal depth) of shifter film thickness on light exposure. These discoveries have made it possible to effectively resolve the problems inherent in prior-art halftone phase shift masks, enabling phase shift masks to be provided which are capable of further reducing the minimum feature size and increasing the level of integration in semiconductor integrated circuits.

Accordingly, in a first aspect, the invention provides a phase shift mask blank comprising a transparent substrate and at least one layer of phase shifter on the substrate, wherein the phase shifter is a film composed primarily of a fluorine-doped metal silicide.

In a second aspect, the invention provides a phase shift mask blank comprising a transparent substrate, at least one layer of phase shifter on the substrate, and at least one layer of chromium-based film on the phase shifter, wherein the phase shifter is a film composed primarily of a fluorine-doped metal silicide. The chromium-based film is preferably a light-shielding film, an antireflection coating or a multilayer combination of both. More specifically, the chromium-based film is a CrC film, CrCO film, CrCN film or CrCON film, or a multilayer combination thereof.

In the phase shift mask blank of the first or second aspect of the invention, the fluorine-doped metal silicide is preferably fluorine-doped chromium silicide, fluorine-doped molybdenum silicide or fluorine-doped gadolinium gallium silicide, and typically contains one or more element selected from among oxygen, nitrogen and carbon. Preferably, the phase shifter composed primarily of a fluorine-doped metal silicide shifts the phase of exposure light passing through it by 180±5 degrees and has a transmittance of 3 to 40%.

In a third aspect, the invention provides a phase shift mask produced by patterning the phase shifter on the phase shift mask blank according to the first or second aspect of the invention.

In a fourth aspect, the invention provides a method of manufacturing a phase shift mask, comprising the steps of forming a phase shifter composed primarily of a fluorine-doped metal silicide on a substrate transparent to exposure light using a sputtering technique, lithographically forming a resist pattern on the phase shifter, and patterning the phase shifter by dry etching or wet etching through the resist pattern.

In a fifth aspect, the invention provides a method of manufacturing a phase shift mask, comprising the steps of forming a phase shifter composed primarily of a fluorine-doped metal silicide on a substrate transparent to exposure light using a sputtering technique, forming a chromium-based film on the phase shifter using a sputtering technique, removing areas of the chromium-based film where exposure to light is necessary by etching so as to leave corresponding areas of the phase shifter exposed on the surface, lithographically forming a resist pattern on the phase shifter, and patterning the phase shifter by dry etching or wet etching through the resist pattern.

In the phase shift mask manufacturing method according to the fourth and fifth aspects of the invention, the fluorine-doped metal silicide is preferably fluorine-doped chromium silicide, fluorine-doped molybdenum silicide or fluorine-doped gadolinium gallium silicide. In the step of forming a phase shifter, sputtering is preferably carried out using chromium, molybdenum or gadolinium gallium as the target, and using $SiF_4$ as the reactive gas; or using chromium silicide, molybdenum silicide or gadolinium gallium silicide as the target, and using $SiF_4$, $CF_4$ or $NF_3$ as the reactive gas.

In the inventive method, sputtering is typically carried out by reactive sputtering using a mixed gas composed of an element source gas which supplies an element selected from among oxygen, nitrogen and carbon in admixture with an inert gas and the reactive gas. Preferably, the element source gas is used at a flow rate such that the elemental ratio of the element thus supplied relative to the inert gas is 1 to 40% for oxygen, 1 to 20% for nitrogen, and 1 to 10% for carbon. In the manufacturing method of the invention, it is preferable for the phase shifter composed primarily of fluorine-doped metal silicide to shift the phase of exposure light passing through it by 180±5 degrees and to have a transmittance of 3 to 40%.

BRIEF DESCRIPTION OF THE DRAWINGS

The above and other objects, features and advantages of the invention will become more apparent from the following detailed description, taken in conjunction with the accompanying drawings.

FIG. 6 are schematic sectional views illustrating the method of manufacturing phase shift masks according to the invention. FIG. 6A shows the mask blank on which a resist film has been formed, FIG. 6B shows the mask workpiece after the resist film has been patterned, FIG. 6C shows the workpiece after dry etching or wet etching, and FIG. 6D shows the completed mask after the resist film has been removed.

FIG. 7 is a sectional view showing another embodiment of a phase shift mask according to the invention.

DETAILED DESCRIPTION OF THE INVENTION

Figure 1:
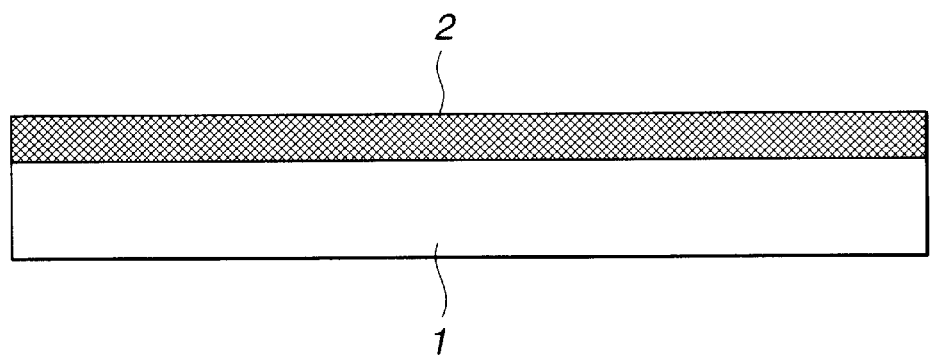
FIG. 1 is a sectional view of a phase shift mask blank according to one embodiment of the invention.
Figure 2:
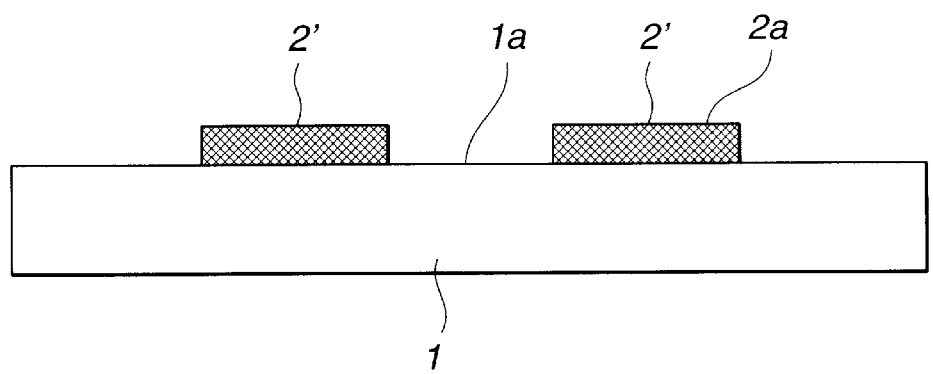
FIG. 2 is a sectional view of a phase shift mask made from the same blank.

As shown in FIG. 1, the phase shift mask blank of the invention comprises a substrate 1 which is made of a material such as quartz or $CaF_2$ that is transparent to the exposure light and substantially the entire surface of which is overlaid with a phase shifter 2. The phase shift mask of the invention is manufactured by patterning the phase shifter 2 on the phase shift mask blank. Referring to FIG. 2, the phase shift mask has a first light-transmitting region 1a between two patterned phase shifters 2' and 2', and each phase shifter 2' forms a second light-transmitting region 2a. In the phase shift mask of the invention, the phase shifter 2 (i.e., the patterned phase shifter 2' serving as the second light-transmitting region) is made of a film composed primarily of fluorine-doped metal silicide. Preferably, the film is formed to a thickness such as to give, at the exposure wavelength, a phase shift of 180±5 degrees and a transmittance of 3 to 40%.

The fluorine-doped metal silicide making up the phase shifter is preferably fluorine-doped chromium silicide, fluorine-doped molybdenum silicide or fluorine-doped gadolinium gallium silicide.

The phase shifter can be formed by a reactive sputtering process. For example, to form phase shifters made of fluorine-doped chromium silicide, it is preferable to use as the target either chromium alone or sintered chromium silicide. To form phase shifters made of fluorine-doped molybdenum silicide, it is preferable to use molybdenum alone or sintered molybdenum silicide as the target. To form phase shifters made of fluorine-doped gadolinium gallium silicide, the use of gadolinium gallium alone or sintered gadolinium gallium silicide as the target is preferred. The purpose here is to be able to carry out reactive sputtering which provides phase shifters having a relatively high refractive index and the desired transmittance to 247 nm, 193 nm or 157 nm light.

When chromium alone, molybdenum alone or gadolinium gallium alone is used as the sputtering target, it is preferable for the reactive gas to be $SiF_4$. Employing $SiF_4$ as the reactive gas when such a metal is used alone as the target provides a film which, in spite of some degree of variation in the stoichiometric composition, can be characterized as a metal silicide. When chromium silicide, molybdenum silicide or gadolinium gallium silicide is used as the sputtering target, it is preferable for the reactive gas to be one or more selected from among $SiF_4$, $CF_4$ and $NF_3$.

In the practice of the invention, sputtering carried out using a metal alone or a metal silicide as the target and using $SiF_4$ as the reactive gas provides a fluorine-doped metal silicide film which contains fluorine atoms, has an adequate transmittance to short wavelengths of 193 nm or less, and is capable of enduring high-energy radiation while remaining relatively stable over time.

The sputtering process employed in the invention may be one which employs a direct-current power supply (d.c. sputtering) or a high-frequency power supply (RF sputtering). The use of magnetron sputtering or conventional sputtering is also possible. The film-forming system may be either a continuous, in-line system or a single-workpiece processing system.

The sputtering gas may be an inert gas such as argon or xenon. It is preferable to carry out reactive sputtering using a mixed gas comprising any of various element source gases for supplying oxygen, nitrogen or carbon (e.g., carbon gas, nitrogen gas, methane gas, nitrogen monoxide gas, nitrogen dioxide gas) in combination with an inert gas such as argon and a reactive gas such as $SiF_4$. The reason for carrying out reactive sputtering while passing a stream of mixed gas through the sputtering chamber is to alter the refractive index and transmittance of the fluorine-doped metal silicide film being formed so as to achieve optimal film properties for a shifter material. However, even when reactive sputtering is carried out, there is no need for a large flow rate of the element source gas. Because the amount of such gas passed through is only of such a degree as to improve the film quality, the uniformity of the film quality does not decline as the center of the target is approached. Moreover, compared with film formation by reactive sputtering in which a large flow rate of element source gas such as oxygen, nitrogen or methane is passed through from a $MoSi_x$ (where x is 2 to 3) target, as in the case of prior-art molybdenum silicide halftone masks, the proportion of element source gas is small. Hence, particle formation does not readily occur.

To fine-tune the light transmittance or refractive index of the phase shifter film formed from the fluorine-doped metal silicide, the mixed gas used in reactive sputtering may be one prepared by mixing an oxygen, nitrogen or carbon element source (e.g., oxygen, nitrogen, methane, nitrous oxide, carbon monoxide, carbon dioxide) into the sputtering gas (e.g., argon) and the reactive gas (e.g., $SiF_4$). It is possible, in particular, to make selective use of such element source gases according to the intended application. For example, the film properties can be adjusted by introducing oxygen or nitrogen gas when greater transmittance is required, or by introducing a carbon component if the transmittance needs to be lowered.

Varying the proportion of the element source gas enables the refractive index to be varied over a broad range of about 1.8 to about 2.5. By varying the refractive index in this way, the phase shift angle can be changed even at the same film thickness, thus allowing subtle adjustments to be made in the amount of phase shift.

The element source gas can be used at a flow rate such that the element ratio of the element thus supplied relative to the inert gas is 1 to 40% for oxygen, 1 to 20% for nitrogen, and 1 to 10% for carbon. A relatively small amount of the gas used in reactive sputtering is capable of changing the refractive index of the shifter film.

The preferred composition of the metal silicide film thus formed is 20 to 80 atomic % chromium, 5 to 40 atomic % silicon and 1 to 20 atomic % fluorine when the film is made of fluorine-doped chromium silicide; 15 to 50 atomic % molybdenum, 10 to 70 atomic % silicon and 1 to 30 atomic % fluorine when the film is made of fluorine-doped molybdenum silicide; and 5 to 40 atomic % gadolinium, 5 to 40 atomic % gallium, 5 to 30 atomic % silicon and 5 to 30 atomic % fluorine when the film is made of fluorine-doped gadolinium gallium silicide.

The various foregoing metal silicides may contain, in addition to the elements mentioned above, one or more elements selected from among oxygen, nitrogen and carbon. The oxygen content is preferably 0 to 50 atomic %, and especially 1 to 40 atomic %; the nitrogen content is preferably 0 to 30 atomic %, and especially 1 to 20 atomic %; and the carbon content is preferably 0 to 30 atomic %, and especially 1 to 20 atomic %.

Film formation is carried out by adjusting the thickness of the shifter film to the thickness D, defined as $$D=\lambda/2(n-1) \qquad (1)$$

wherein D is the shifter film thickness for generating a 180-degree phase shift, n is the refractive index of the shifter material, and $\lambda$ is the wavelength of the transmitted light.

In the case of a fluorine-doped metal silicide film, the refractive index is about 1.8 to about 2.5, and the target film thickness varies according to the wavelength $\lambda$ of the light source used. Table 1 shows the target film thickness at which a phase shift of 180 degrees is achieved for exposure light from various light sources.

TABLE 1

| Film thickness of shifter material at which a phase shift of 180° is achieved for various light sources (refractive index n = 2.3) | |
|---|---|
| Wavelength ($\lambda$) | Target film thickness |
| KrF    248 nm | 95.3 nm |
| ArF    193 nm | 74.2 nm |
| $F_2$    157 nm | 60.4 nm |

However, because the refractive index often decreases at shorter wavelengths, the film thickness must generally be made thicker than indicated in the table. Moreover, if there is an in-plane distribution in the actual film thickness on the substrate, the film thickness will vary somewhat from the indicated value. Hence, it is desirable to apply the film uniformly to the target thickness at the time of film formation, and to minimize variations in the quality and thickness of the applied film so that the phase shift mask provides a phase shift within what is generally the allowable range of 180±5 degrees.

Also, given that the shifter film on the phase shift mask must have a light transmittance which does not exceed the exposure threshold of the resist (about 5%), it is preferable for the shifter film to be prepared as a material having a transmittance of about 5% at the respective wavelengths. The transmittance can then be suitably adjusted by using as a mixed gas during sputtering the above-described gases serving as sources of elements such as oxygen, nitrogen and carbon. That is, if the transmittance at the respective wavelengths is inadequate, the proportion of primarily oxygen and nitrogen components may be increased so as to increase the level of oxygen and nitrogen components incorporated into the shifter film. On the other hand, if the transmittance at various wavelengths is too high, the amount of carbon gas components such as methane can be increased to raise the level of carbon components incorporated into the film.

A transmittance of about 5% is optimal, although in most cases effective use as a shifter material is possible at a transmittance within a range of about 3 to about 40%, provided this does not exceed the exposure threshold for the resist.

Figure 3:
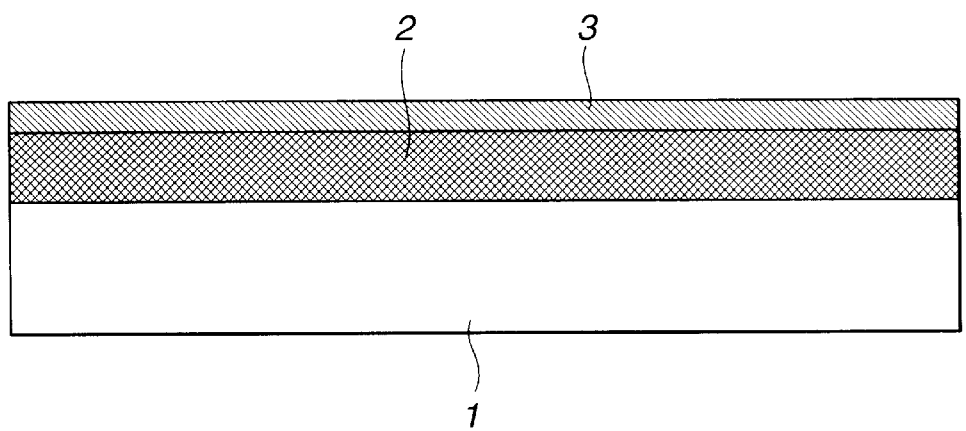
FIG. 3 is a sectional view of a phase shift mask blank provided with a chromium-based light-shielding film according to another embodiment of the invention.

Referring next to FIG. 3, the phase shift mask blank of the invention may additionally comprise at least one layer of chromium-based film 3 formed on the above-described phase shifter 2 composed primarily of fluorine-doped metal silicide. The chromium-based film 3 is preferably a light-shielding film, an antireflection coating or a multilayer combination thereof. A light-shielding film 3 prevents stray light from leaking outside of the exposure pattern region and an antireflection coating reduces reflection from a chromium-based light-shielding film, enabling even more precise patterning to be achieved.

Figure 4:
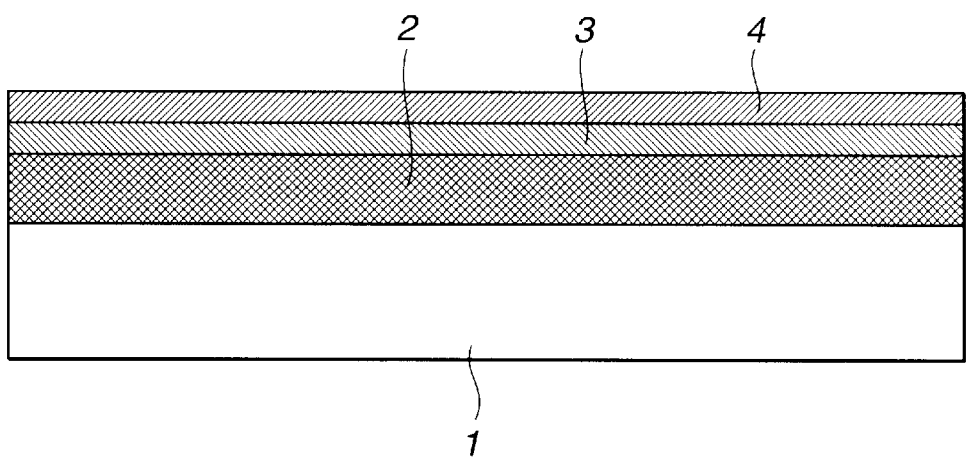
FIG. 4 is a sectional view of a phase shift mask blank provided with a chromium-based light-shielding film and a chromium-based antireflective coating according to yet another embodiment of the invention.
Figure 5:
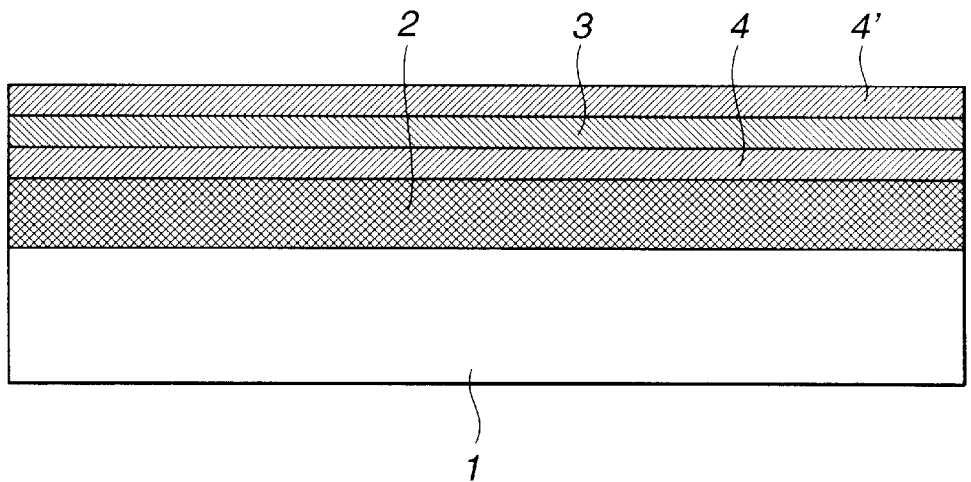
FIG. 5 is a sectional view of a similar type of phase-shift mask blank having a chromium-based light-shielding film and a chromium-based antireflective coating according to a further embodiment of the invention.

In the phase shift mask blank of the invention, the phase shifter can be formed as two or more layers. According to another embodiment of the invention, as shown in FIG. 4, a phase shifter 2 composed primarily of a fluorine-doped metal silicide may be provided thereon with a chromium-based light-shielding film 3, which may in turn have formed thereon a chromium-based antireflection coating 4 that reduces reflection from the chromium-based light-shielding film 3. Alternatively, as shown in FIG. 5, the inventive phase shift mask blank may comprise, in order from the substrate 1 side: a phase shifter 2, a first chromium-based antireflection coating 4, a chromium-based light-shielding film 3, and a second chromium-based antireflection coating 4'.

The chromium-based light-shielding film 3 or antireflection coating 4 is preferably a CrC film, CrCO film, CrCN film or CrCON film, or a multilayer combination thereof. A multilayer combination of two or more layers selected from among a CrCO film, a CrCON film and a CrCON film is especially preferred.

The chromium-based light-shielding layer or antireflection coating can be formed by reactive sputtering in which the target is chromium by itself or chromium to which has been added oxygen, nitrogen, carbon or a combination thereof; and the sputtering gas is an inert gas such as argon or krypton to which carbon dioxide gas has been added as a carbon source.

For example, sputtering gases which may be used to form a CrCON film include a mixed gas composed of at least one each of a carbon-containing gas (e.g., $CH_4$, $CO_2$, CO), a nitrogen-containing gas (e.g., NO, $NO_2$, $N_2$) and an oxygen-containing gas (e.g., $CO_2$, NO, $O_2$), or any such gas mixture in combination with an inert gas such as argon, neon or krypton. Using $CO_2$ gas as both the carbon source and the oxygen source is especially advantageous for uniformity in the plane of the substrate and for controllability during production. Each of the sputtering gases may be separately introduced into the sputtering chamber, or some or all of the gases may first be mixed together then introduced into the chamber.

In the CrC film, the Cr content is preferably 60 to 99 atomic %, especially 70 to 95 atomic %, and the C content is the balance. In the CrCO film, the Cr content is preferably 20 to 95 atomic %, especially 30 to 85 atomic %, the C content is preferably 1 to 30 atomic %, especially 5 to 20 atomic %, and the O content is preferably 1 to 60 atomic %, especially 5 to 50 atomic %. In the CrCN film, the Cr content is preferably 20 to 95 atomic %, especially 50 to 85 atomic %, the C content is preferably 1 to 30 atomic %, especially 5 to 20 atomic %, and the N content is preferably 1 to 60 atomic %, especially 5 to 30 atomic %. In the CrCON film, the Cr content is preferably 20 to 95 atomic %, especially 30 to 80 atomic %, the C content is preferably 1 to 20 atomic %, especially 2 to 15 atomic %, the O content is preferably 1 to 60 atomic %, especially 5 to 50 atomic %, and the N content is preferably 1 to 30 atomic %, especially 3 to 20 atomic %.

The phase shift mask of the invention is manufactured by patterning the phase shifters on the phase shift mask blank produced as described above.

More specifically, as shown in FIG. 6, manufacture of the phase shift mask of the invention may be carried out by a process in which a fluorine-doped metal silicide film 12 is formed on a substrate 11, and a resist film 13 is subsequently formed on the metal silicide film 12 (FIG. 6A). Next, the resist film 13 is patterned (FIG. 6B), after which the fluorine-doped metal silicide film 12 is dry etched or wet-etched (FIG. 6C), and the resist film 13 is subsequently stripped (FIG. 6D). In this process, application of the resist film, patterning (exposure and development), etching, and removal of the resist film may be carried out by known methods.

In cases where a chromium-based film 3 is formed on the fluorine-doped metallic silicide layer, a phase shift mask on which the chromium-based film 3 remains at the peripheral edges of the substrate 1 (see FIG. 7) can be produced by etching away the chromium-based film 3 in the regions that must be exposed to light, thereby leaving the surface of the phase shifter 2a exposed, then patterning the phase shifter 2a as described above. Alternatively, a phase shift mask can be produced by applying a resist to the chromium-based film 3 and patterning the resist, then using dry etching or wet etching to pattern the chromium-based film 3 and the phase shifter 2a. The regions of the chromium-based film 3 which must be exposed to light are then removed by selective etching so as to leave the phase shift pattern exposed at the surface.

EXAMPLES

The following examples are provided by way of illustration, and are not intended to limit the scope of the invention.

Example 1

Figure 8:
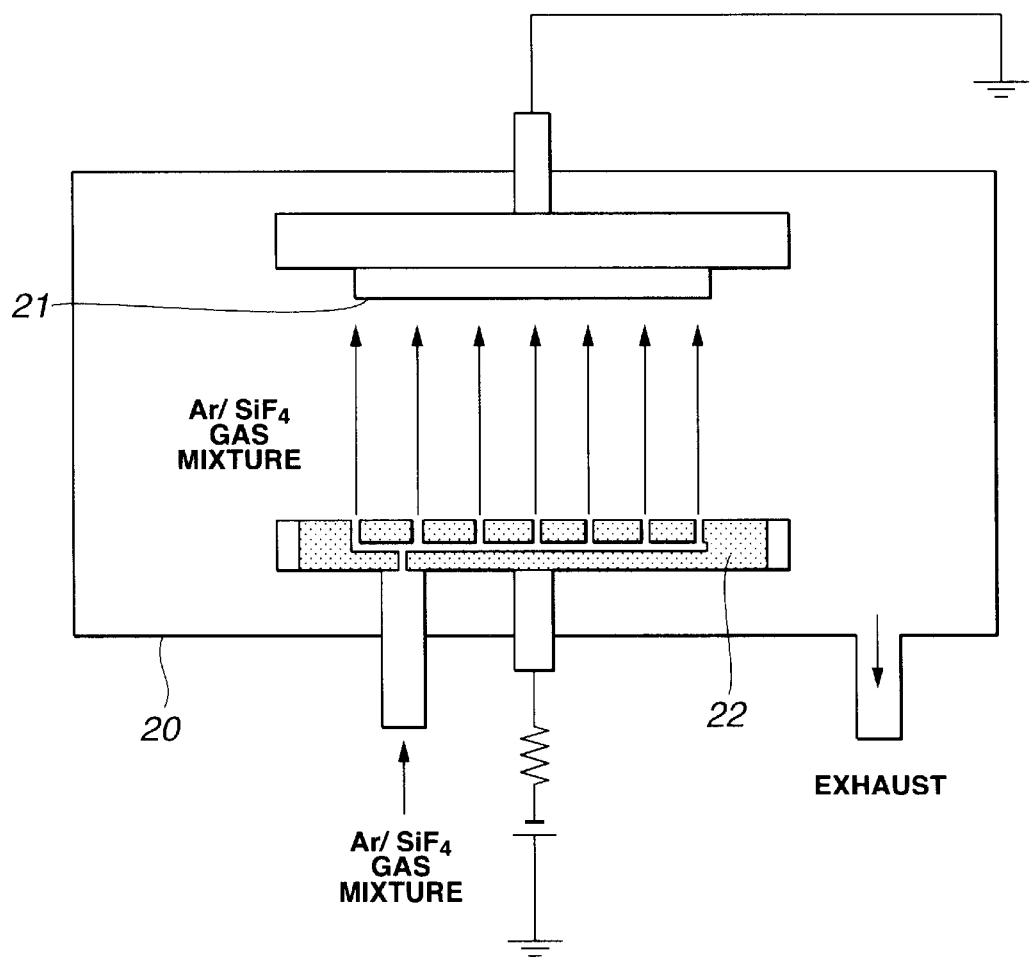
FIG. 8 is a schematic of the d.c. sputtering system used in the examples described in the specification.

A fluorine-doped chromium silicide film was formed on a quartz substrate in the d.c. sputtering system shown in FIG. 8. The system had a d.c. sputtering chamber 20 containing a quartz substrate 21 and a target 22. Using chromium as the target, argon as the sputtering gas (flow rate, 30 sccm) and $SiF_4$ as the reactive gas (flow rate, 10 sccm), reactive sputtering was carried out while passing a shower of these mixed gases (argon/$SiF_4$) through the chamber in the manner shown in FIG. 8, thereby forming a 78.0 nm shifter film.

The sputtering conditions are shown in Table 2. The properties (thickness, refractive index, transmittance) of the resulting film were measured with a GESP-5 spectroscopic ellipsometry system manufactured by SOPRA. The results are presented in Table 3. Table 6 gives the film composition, as determined by electron spectroscopy for chemical analysis (ESCA). In Table 2 and below, the target-to-substrate distance is abbreviated as "TS distance."

Example 5

A CrCON film was formed to a thickness of 85 nm by DC magnetron sputtering on the fluorine-doped chromium silicide film obtained in Example 1. Chromium was used as the target, and the gases passed through the system during sputtering were argon (flow rate, 30 sccm), $CO_2$ (10 scam) and $N_2$ (3 sccm). Other sputtering conditions included a gas pressure during discharge of 0.3 Pa, a power of 500 W, and a film-forming temperature of 120° C.

The film composition, as determined by ESCA, was 59 atomic % chromium, 12 atomic % carbon, 26 atomic % oxygen and 3 atomic % nitrogen.

TABLE 2

|  | Sputtering gas | Reactive gas | Power density | Substrate temperature | Sputtering pressure | TS distance | Target |
|---|---|---|---|---|---|---|---|
| Example 1 | Ar (30 sccm) | $SiF_4$ (10 sccm) | 15 W/cm² | 130° C. | 0.5 Pa | 70 mm | Cr |

TABLE 3

| Film | Refractive index | | Transmittance | |
|---|---|---|---|---|
| thickness | 248 nm | 193 nm | 248 nm | 193 nm |
| Example 1 78.0 nm | 2.12 | 1.93 | 13% | 7% |

Examples 2 to 4

A shifter film was formed in the same way as in Example 1, but under the sputtering conditions shown in Table 4. The film properties are shown in Table 5. Table 6 gives the film composition in each example, as determined by ESCA.

TABLE 4

|  | Mixed gas composition (sccm) | | | | Power density (W/cm²) | Substrate temperature (° C.) | Sputtering pressure (Pa) | TS distance (mm) | Target |
|---|---|---|---|---|---|---|---|---|---|
|  | Ar | $SiF_4$ | $O_2$ | $N_2$ | | | | | |
| Example 2 | 30 | 10 | 1 | — | 15 | 130 | 0.7 | 70 | Cr |
| Example 3 | 40 | 1 | — | 1 | 10 | 130 | 0.4 | 50 | CrSi |
| Example 4 | 50 | 2 | 10 | 3 | 10 | 130 | 0.5 | 50 | CrSi |

TABLE 5

| Film | Refractive index | | Transmittance | |
|---|---|---|---|---|
| thickness | 248 nm | 193 nm | 248 nm | 193 nm |
| Example 2 80.3 nm | 2.23 | 2.02 | 17% | 8% |
| Example 3 84.6 nm | 2.36 | 2.10 | 25% | 11% |
| Example 4 82.8 nm | 2.32 | 2.18 | 34% | 17% |

TABLE 6

| | Film composition (atomic %) | | | | |
|---|---|---|---|---|---|
|  | Cr | Si | F | O | N |
| Example 1 | 55 | 29 | 12 | 2[1] | 2[2] |
| Example 2 | 53 | 28 | 12 | 5 | 2[2] |
| Example 3 | 80 | 8 | 3 | 3[1] | 6 |
| Example 4 | 43 | 11 | 6 | 32 | 8 |

[1] Background (O)
[2] Background (N)

Example 6

A fluorine-doped molybdenum silicide film was formed on a quartz substrate in the d.c. sputtering system shown in FIG. 8. Using molybdenum as the target, argon as the sputtering gas (flow rate, 30 scam) and $SiF_4$ as the reactive gas (flow rate, 15 scam), reactive sputtering was carried out while passing a shower of these mixed gases (argon/$SiF_4$) through the chamber in the manner shown in FIG. 8, thereby forming a 79.6 nm shifter film.

The sputtering conditions are shown in Table 7. The properties (thickness, refractive index, transmittance) of the resulting film were measured with a GESP-5 spectroscopic ellipsometry system manufactured by SOPRA. The results are presented in Table 8. Table 11 gives the film composition, as determined by ESCA.

TABLE 7

|  | Sputtering gas | Reactive gas | Power density | Substrate temperature | Sputtering Pressure | TS distance | Target |
|---|---|---|---|---|---|---|---|
| Example 6 | Ar (30 sccm) | SiF$_4$ (15 sccm) | 13 W/cm$^2$ | 130° C. | 0.8 Pa | 70 mm | Mo |

TABLE 8

|  | Film thickness | Refractive index 248 nm | Refractive index 193 nm | Transmittance 248 nm | Transmittance 193 nm |
|---|---|---|---|---|---|
| Example 6 | 79.6 nm | 2.02 | 1.93 | 8% | 4% |

Examples 7 to 9

A shifter film was formed in the same way as in Example 6, but under the sputtering conditions shown in Table 9. The film properties are shown in Table 10. Table 11 gives the film composition in each example, as determined by ESCA.

TABLE 9

|  | Mixed gas composition (sccm) Ar | SiF$_4$ | O$_2$ | N$_2$ | Power density (W/cm$^2$) | Substrate temperature (° C.) | Sputtering Pressure (Pa) | TS distance (mm) | Target |
|---|---|---|---|---|---|---|---|---|---|
| Example 7 | 30 | 10 | 3 | — | 18 | 130 | 0.9 | 70 | Mo |
| Example 8 | 40 | 1 | — | 1 | 13 | 130 | 0.6 | 50 | MoSi$_{2.0}$ |
| Example 9 | 40 | 2 | 10 | 3 | 13 | 130 | 0.6 | 50 | MoSi$_{2.0}$ |

TABLE 10

|  | Film thickness | Refractive index 248 nm | Refractive index 193 nm | Transmittance 248 nm | Transmittance 193 nm |
|---|---|---|---|---|---|
| Example 7 | 82.5 nm | 2.23 | 2.02 | 11% | 6% |
| Example 8 | 80.3 nm | 2.36 | 2.10 | 17% | 9% |
| Example 9 | 79.3 nm | 2.32 | 2.18 | 19% | 10% |

TABLE 11

|  | Film composition (atomic %) | | | | |
|---|---|---|---|---|---|
|  | Mo | Si | F | O | N |
| Example 6 | 31 | 39 | 25 | 3[1] | 2[2] |
| Example 7 | 37 | 34 | 18 | 9 | 2[2] |
| Example 8 | 26 | 61 | 4 | 3[1] | 6 |
| Example 9 | 18 | 38 | 7 | 25 | 12 |

[1]Background (O)
[2]Background (N)

Example 10

A CrCON film was formed to a thickness of 85 nm by DC magnetron sputtering on the fluorine-doped molybdenum silicide film obtained in Example 6. Chromium was used as the target, and the gases passed through the system during sputtering were argon (flow rate, 30 sccm), CO$_2$ (10 sccm) and N$_2$ (3 sccm). Other sputtering conditions included a gas pressure during discharge of 0.3 Pa, a power of 500 W, and a film-forming temperature of 120° C.

The film composition, as determined by ESCA, was 59 atomic % chromium, 12 atomic % carbon, 26 atomic % oxygen and 3 atomic % nitrogen.

Example 11

Figure 9:
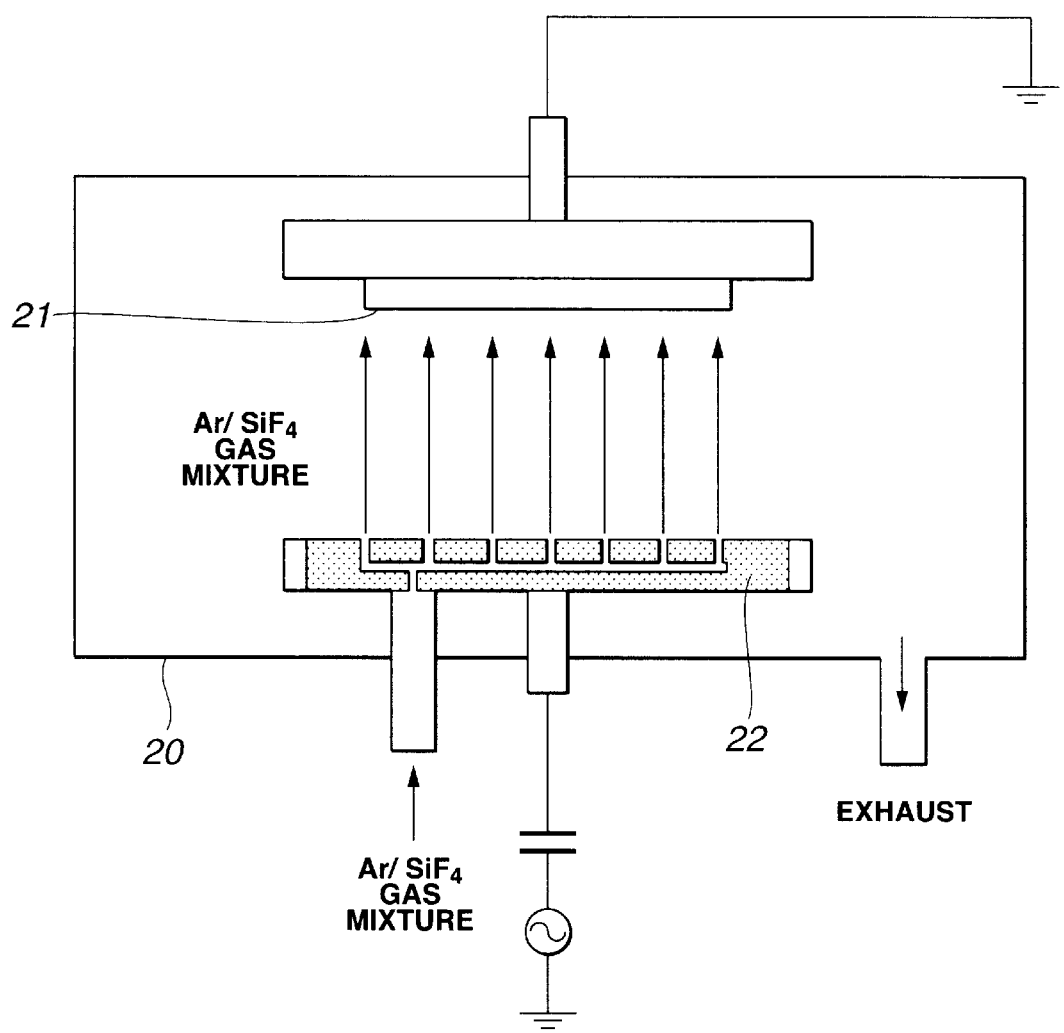
FIG. 9 is a schematic of the RF sputtering system used in the examples.
Figure 10A:
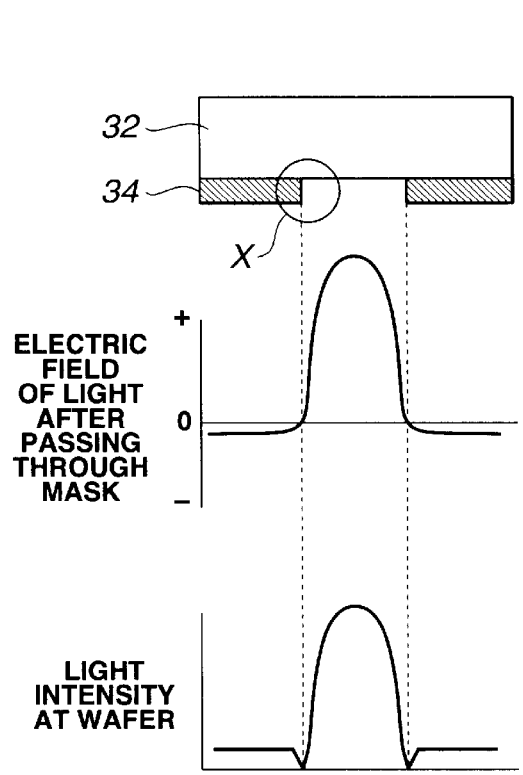
FIGS. 10A and B illustrate the operating principle of a halftone phase shift mask.
Figure 10B:
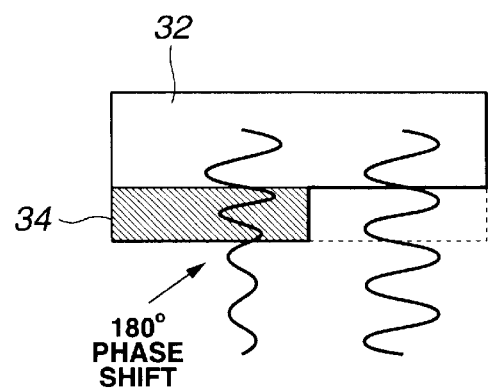
FIG. 10B is an enlarged view of region X in FIG. 10A.

A fluorine-doped gadolinium gallium silicide film was formed on a quartz substrate in the r.f. sputtering system shown in FIG. 9. The system had a r.f. sputtering chamber 20 containing a quartz substrate 21 and a target 22. Using gadolinium gallium garnet (GGG) as the target, argon as the sputtering gas (flow rate, 30 sccm) and SiF$_4$ as the reactive gas (10 sccm), reactive sputtering was carried out while passing a shower of these mixed gases (argon/SiF$_4$) through the chamber in the manner shown in FIG. 9, thereby forming a 82.4 nm shifter film.

The sputtering conditions are shown in Table 12. The properties (thickness, refractive index, transmittance) of the resulting film were measured with a GESP-5 spectroscopic ellipsometry system manufactured by SOPRA. The results are presented in Table 13. Table 16 gives the film composition, as determined by ESCA.

TABLE 12

|  | Sputtering gas | Reactive gas | Power density | Substrate temperature | Sputtering pressure | TS distance | Target |
|---|---|---|---|---|---|---|---|
| Example 11 | Ar (30 sccm) | SiF$_4$ (10 sccm) | 10 W/cm$^2$ | 130° C. | 0.8 Pa | 70 mm | GGG |

TABLE 13

| | Film thickness | Refractive index 248 nm | Refractive index 193 nm | Transmittance 248 nm | Transmittance 193 nm |
|---|---|---|---|---|---|
| Example 11 | 82.4 nm | 2.32 | 2.18 | 12% | 7% |

Examples 12 to 14

A shifter film was formed in the same way as in Example 11, but under the sputtering conditions shown in Table 14. The film properties are shown in Table 15. Table 16 gives the film composition in each example, as determined by ESCA.

TABLE 14

| | Mixed gas composition (sccm) | | | | Power density $(W/cm^2)$ | Substrate temperature (° C.) | Sputtering pressure (Pa) | TS distance (mm) | Target |
|---|---|---|---|---|---|---|---|---|---|
| | Ar | $SiF_4$ | $O_2$ | $N_2$ | | | | | |
| Example 12 | 30 | 10 | 3 | — | 18 | 130 | 0.8 | 70 | GGG |
| Example 13 | 40 | 15 | — | 1 | 13 | 130 | 1.2 | 70 | GGG |
| Example 14 | 40 | 20 | 5 | 3 | 18 | 130 | 1.2 | 70 | GGG |

TABLE 15

| | Film thickness | Refractive index 248 nm | Refractive index 193 nm | Transmittance 248 nm | Transmittance 193 nm |
|---|---|---|---|---|---|
| Example 12 | 78.5 nm | 2.33 | 2.02 | 15% | 8% |
| Example 13 | 81.3 nm | 2.36 | 2.10 | 13% | 6% |
| Example 14 | 79.0 nm | 2.42 | 2.18 | 22% | 12% |

TABLE 16

| | Film composition (atomic %) | | | | | |
|---|---|---|---|---|---|---|
| | Gd | Ga | Si | F | O | N |
| Example 11 | 28 | 24 | 12 | 10 | 24 | 2[1)] |
| Example 12 | 26 | 22 | 12 | 10 | 28 | 2[1)] |
| Example 13 | 24 | 22 | 17 | 14 | 18 | 5 |
| Example 14 | 13 | 10 | 20 | 18 | 31 | 8 |

[1)]Background (N)

Example 15

A CrCON film was formed to a thickness of 85 nm by DC magnetron sputtering on the fluorine-doped gadolinium gallium silicide film obtained in Example 11. Chromium was used as the target, and the gases passed through the system during sputtering were argon (30 sccm), $CO_2$ (10 sccm) and $N_2$ (3 sccm). Other sputtering conditions included a gas pressure during discharge of 0.3 Pa, a power of 500 W, and a film-forming temperature of 120° C.

The film composition, as determined by ESCA, was 59 atomic % chromium, 12 atomic % carbon, 26 atomic % oxygen and 3 atomic % nitrogen.

As is apparent from the results obtained in the above examples, the phase shift mask blanks and phase shift masks according to the invention have good light transmittance and stability over time even when used with a light source that emits light having a short wavelength of 193 nm or less, such as ArF excimer laser light or $F_2$ laser light. The phase shift masks thus obtained have a high performance which enable semiconductor integrated circuits to be fabricated to a smaller minimum feature size and a higher level of integration.

Japanese Patent Application Nos. 2000-000332, 2000-000333, 2000-000336 and 2000-309453 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift mask blank comprising a transparent substrate and at least one layer of phase shifter on the substrate, wherein the phase shifter is a film composed primarily of a fluorine-doped metal silicide comprising a fluorine-doped chromium silicide, fluorine-doped molybdenum silicide or fluorine-doped gadolinium gallium silicide, and at least one of oxygen, nitrogen or carbon.

2. The phase shift mask blank of claim 1, wherein the phase shifter composed primarily of a fluorine-doped metal silicide shifts the phase of exposure light passing through it by 180±5 degrees and has a transmittance of 3 to 40%.

3. A phase shift mask manufactured by patterning the phase shifter on the phase shift mask blank of claim 1.

4. The phase shift mask blank according to claim 1, wherein the fluorine-doped metal silicide comprises 1–40 atomic % of oxygen.

5. The phase shift mask blank according to claim 1, wherein the fluorine-doped metal silicide comprises 1–20 atomic % of nitrogen.

6. The phase shift mask blank according to claim 1, wherein the fluorine-doped metal silicide comprises 1–20 atomic % of carbon.

7. A phase shift mask blank according to claim 1, wherein the fluorine-doped metal silicide is fluorine-doped chromium silicide comprising 20–80 atomic % chromium, 5–40 atomic % silicon, and 1–20 atomic % fluorine.

8. A phase shift mask blank according to claim 1, wherein the fluorine-doped metal silicide is fluorine-doped molybdenum silicide comprising 15–50 atomic % molybdenum, 10–70 atomic % silicon, and 1–30 atomic % fluorine.

9. A phase shift mask blank according to claim 1, wherein the fluorine-doped metal silicide is fluorine-doped gadolinium gallium silicide comprising 5–40 atomic % gadolinium, 5–30 atomic % silicon and 5–30 atomic % fluorine.

10. A phase shift mask blank comprising a transparent substrate, at least one layer of phase shifter on the substrate, the phase shifter being a film composed primarily of a fluorine-doped metal silicide comprising a fluorine-doped chromium silicide, fluorine-doped molybdenum silicide or fluorine-doped gadolinium gallium silicide, and at least one element of oxygen, nitrogen or carbon, and at least one layer of chromium-based film which is a light-shielding film, an antireflection coating or a multilayer combination of both, on the phase shifter.

11. The phase shift mask blank of claim 10, wherein the chromium-based film is a CrC film, CrCO film, CrCN film or CrCON film, or a multilayer combination thereof.

12. The phase shift mask blank of claim 10, wherein the chromium-based film is a CrCON film or a multiplayer combination of two or more layers of CrCON film.

13. A method of manufacturing a phase shift mask, comprising the steps of:

forming a phase shifter composed primarily of a fluorine-doped metal silicide comprising a fluorine-doped chromium suicide, fluorine-doped molybdenum silicide or fluorine-doped gadolinium gallium silicide, and at least one element of oxygen, nitrogen or carbon, on a substrate transparent to exposure light using a sputtering technique wherein the sputtering is carried out using chromium silicide, molybdenum silicide or gadolinium gallium silicide as the target, and using $SiF_4$, $CF_4$ or $NF_3$ as the reactive gas, lithographically forming a resist pattern on the phase shifter, and patterning the phase shifter by dry etching or wet etching through the resist pattern.

14. The phase shift mask manufacturing method of claim 13, wherein in the step of forming a phase shifter, sputtering is carried out using chromium, molybdenum or gadolinium gallium as the target, and using $SiF_4$ as the reactive gas.

15. The phase shift mask manufacturing method of claim 13, wherein in the step of forming a phase shifter, sputtering is carried out by reactive sputtering using a mixed gas composed of an element source gas which supplies an element selected from among oxygen, nitrogen and carbon in admixture with an inert gas and a reactive gas.

16. The phase shift mask manufacturing method of claim 15, wherein the element source gas is used at a flow rate such that the element ratio of the element thus supplied relative to the inert gas is 1 to 40% for oxygen, 1 to 20% for nitrogen, and 1 to 10% for carbon.

17. The phase shift mask manufacturing method of claim 13, wherein the phase shifter composed primarily of fluorine-doped metal silicide shifts the phase of exposure light passing through it by 180±5 degrees and has a transmittance of 3 to 40%.

18. A method of manufacturing a phase shift mask, comprising the steps of:

forming a phase shifter composed primarily of a fluorine-doped metal silicide comprising a fluorine-doped chromium silicide, fluorine-doped molybdenum silicide or fluorine-doped gadolinium gallium silicide, and at least one element of oxygen, nitrogen or carbon, on a substrate transparent to exposure light using a sputtering technique, wherein the sputtering is carried out using chromium silicide, molybdenum silicide or gadolinium gallium silicide as the target, and using $SiF_4$, $CF_4$ or $NF_3$ as the reactive gas, forming a chromium-based film on the phase shifter using a sputtering technique, removing areas of the chromium-based film where exposure to light is necessary by etching so as to leave corresponding areas of the phase shifter exposed on the surface, lithographically forming a resist pattern on the phase shifter, and patterning the phase shifter by dry etching or wet etching through the resist pattern.

19. A phase shift mask blank comprising a transparent substrate and at least one layer of phase shifter on the substrate, wherein the phase shifter is a film composed primarily of a fluorine-doped metal silicide which is a fluorine-doped chromium silicide, fluorine-doped molybdenum silicide or fluorine-doped gadolinium gallium silicide, and at least one of oxygen, nitrogen or carbon.

20. A phase shift mask blank comprising a transparent substrate and at least one layer of phase shifter on the substrate, wherein the phase shifter is a film consisting essentially of a fluorine-doped metal silicide comprising a fluorine-doped chromium silicide, fluorine-doped molybdenum silicide or fluorine-doped gadolinium gallium silicide, and at least one of oxygen, nitrogen or carbon.

* * * * *